(12) United States Patent
Wu et al.

(10) Patent No.: US 11,536,614 B2
(45) Date of Patent: Dec. 27, 2022

(54) TEMPERATURE DETECTOR

(71) Applicant: RichWave Technology Corp., Taipei (TW)

(72) Inventors: Po-Wei Wu, Taipei (TW); Tien-Yun Peng, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/246,734

(22) Filed: May 3, 2021

(65) Prior Publication Data
US 2022/0307916 A1    Sep. 29, 2022

(30) Foreign Application Priority Data

Mar. 26, 2021    (TW) .................................. 110111096

(51) Int. Cl.
| | |
|---|---|
| *H03F 1/30* | (2006.01) |
| *H03F 3/45* | (2006.01) |
| *H03F 3/04* | (2006.01) |
| *G01K 7/21* | (2006.01) |

(52) U.S. Cl.
CPC ............... *G01K 7/21* (2013.01); *H03F 1/302* (2013.01); *H03F 3/4508* (2013.01); *H03F 2200/447* (2013.01)

(58) Field of Classification Search
CPC ......... G01K 7/21; H03F 1/302; H03F 3/4508; H03F 2200/447

USPC ........................................ 330/289, 285, 296
See application file for complete search history.

(56) References Cited

U.S. PATENT DOCUMENTS

| | | | |
|---|---|---|---|
| 4,010,486 A | 3/1977 | Suzuki | |
| 2018/0123528 A1 | 5/2018 | Jo | |
| 2020/0099339 A1 | 3/2020 | Chen | |
| 2020/0212849 A1* | 7/2020 | Kobayashi | ............... H03F 1/30 |

OTHER PUBLICATIONS

European search report dated Jun. 14, 2022 for the EP application No. 21216744.9, filing date Dec. 22, 2021, pp. 1-8, Jun. 14, 2022.

* cited by examiner

*Primary Examiner* — Hieu P Nguyen
(74) *Attorney, Agent, or Firm* — Winston Hsu

(57) ABSTRACT

A temperature detector is used to detect a temperature of a circuit under test, and includes a temperature coefficient component, a multiplier, an impedance component and a node. The temperature coefficient component is arranged in proximity to the circuit under test. A control terminal of the multiplier is coupled to a second terminal of the temperature coefficient component. The impedance component is coupled between the second terminal of the temperature coefficient component and the control terminal of the multiplier, or between a second terminal of the multiplier and a third voltage terminal. The node is formed between the second terminal of the temperature coefficient component and the control terminal of the multiplier. A voltage at the node and an amplified detection current flowing to a first terminal of the multiplier are positively correlated to the temperature of the circuit under test.

19 Claims, 7 Drawing Sheets

TEMPERATURE DETECTOR

CROSS REFERENCE TO RELATED APPLICATION

This non-provisional application claims priority of Taiwan patent application No. 110111096, filed on 26 Mar. 2021, included herein by reference in its entirety.

TECHNICAL FIELD

The present invention relates to a temperature detector, in particular to a temperature detector capable of generating an amplified detection current to reflect temperature variations of a circuit under test.

BACKGROUND

The performances of electronic devices may be affected by temperature variations, and therefore, the amounts of temperature variations may be a crucial parameter to be considered in the design of the electronic devices. Typically, a temperature detector is utilized to measure the temperature variations. However, how to improve sensitivity and accuracy of a temperature measurement for the temperature detector remains a design challenge.

SUMMARY

According to an embodiment of the invention, a temperature detector capable of detecting a temperature of a circuit under test includes a first temperature coefficient component, a multiplier, a first impedance component and a node. The first temperature coefficient component is arranged in proximity to the circuit under test, and includes a first terminal coupled to a first voltage terminal or a second voltage terminal, and a second terminal. The multiplier includes a first terminal coupled to the first voltage terminal or the second voltage terminal, a second terminal coupled to a third voltage terminal, and a control terminal coupled to the second terminal of the first temperature coefficient component. The first impedance component is coupled between the second terminal of the first temperature coefficient component and the control terminal of the multiplier or between the second terminal of the multiplier and the third voltage terminal. The node is formed between the second terminal of the first temperature coefficient component and the control terminal of the multiplier. A voltage at the node is positively correlated to the temperature of the circuit under test, and an amplified detection current flowing to the first terminal of the multiplier is positively correlated to the temperature of the circuit under test.

According to another embodiment of the invention, a bias generator includes a temperature detector and a bias module. The temperature detector capable of detecting a temperature of a circuit under test includes a first temperature coefficient component, a multiplier, a first impedance component and a node. The first temperature coefficient component is arranged in proximity to the circuit under test, and includes a first terminal coupled to a first voltage terminal or a second voltage terminal, and a second terminal. The multiplier includes a first terminal coupled to the first voltage terminal or the second voltage terminal, a second terminal coupled to a third voltage terminal, and a control terminal coupled to the second terminal of the first temperature coefficient component. The first impedance component is coupled between the second terminal of the first temperature coefficient component and the control terminal of the multiplier or between the second terminal of the multiplier and the third voltage terminal. The node is formed between the second terminal of the first temperature coefficient component and the control terminal of the multiplier. The bias module includes an input terminal coupled to the first terminal of the multiplier, and an output terminal coupled to the circuit under test. The voltage at the node is positively correlated to the temperature of the circuit under test, and an amplified detection current flowing to the first terminal of the multiplier is positively correlated to the temperature of the circuit under test.

DETAILED DESCRIPTION

Figure 1:
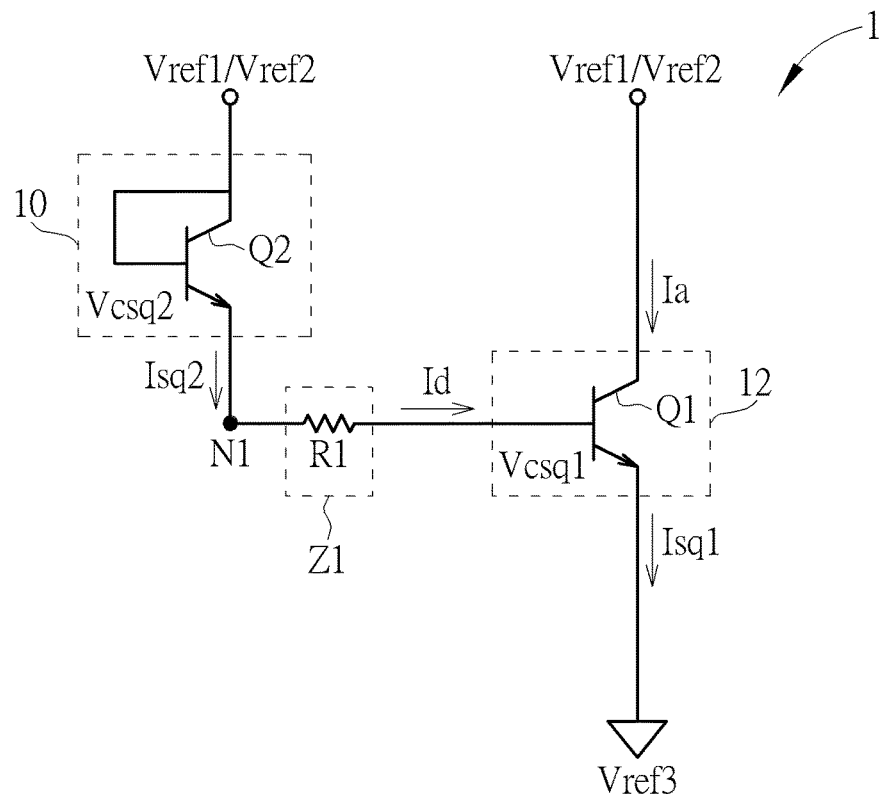
FIG. 1 is a circuit schematic of a temperature detector according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like components throughout.

FIG. 1 is a circuit schematic of a temperature detector 1 according to an embodiment of the invention. The temperature detector 1 may be used to detect a temperature of a circuit under test, and generate an amplified detection current Ia accordingly. The temperature of the circuit under test may change over time. In other words, the temperature detector 1 may generate the amplified detection current Ia to reflect upon the temperature variation of the circuit under test.

The temperature detector 1 may include a temperature coefficient component 10, a multiplier 12 and a node N1. The temperature coefficient component 10 may be arranged in proximity to the circuit under test, for example, 20 to 50 micrometers from the circuit under test, so as to accurately detect the temperature of the circuit under test. The temperature coefficient component 10 may include a first terminal and a second terminal. The first terminal of the temperature coefficient component 10 may be coupled to a first voltage terminal or a second voltage terminal. The multiplier 12 may include a first terminal, a second terminal and a control terminal. The first terminal of the multiplier 12 may be coupled to the first voltage terminal or the second voltage terminal, the second terminal of the multiplier 12 may be coupled to a third voltage terminal, and the control terminal of the multiplier 12 may be coupled to the second terminal of the temperature coefficient component 10. The first terminal of the temperature coefficient component 10 and the first terminal of the multiplier 12 may be selectively coupled to the same or different voltage terminals based on actual applications and design requirements. The first voltage terminal may be used to provide a voltage Vref1. The second voltage terminal may be used to provide a voltage Vref2. The voltages Vref1 and Vref2 may be operating voltages of the system, and may be substantially constant. Further, the voltages Vref1 and Vref2 may have identical or different electrical potentials. In some embodiments, the voltage Vref1 and/or Vref2 may be provided by an external circuit, and the external circuit may be, for example, a low dropout regulator (LDO). The third voltage terminal may be used to provide a voltage Vref3. The voltage Vref3 may be a ground voltage of the system, e.g., 0V The node N1 is formed between the second terminal of the temperature coefficient component 10 and the control terminal of the multiplier 12.

The temperature coefficient component 10 may be a negative temperature coefficient component having a turn-on voltage negatively correlated to the temperature of the circuit under test. The temperature coefficient component 10 may include a transistor Q2. The transistor Q2 may include a first terminal coupled to the first terminal of the temperature coefficient component 10, a second terminal coupled to the second terminal of the temperature coefficient component 10, and a control terminal coupled to the first terminal of the transistor Q2. In other words, the transistor Q2 is a diode-connected transistor. The turn-on voltage of the temperature coefficient component 10 may be equal to a voltage Vcsq2 between the control terminal and the second terminal of the transistor Q2. When the temperature of the circuit under test increases, the voltage Vcsq2 decreases; and when the temperature of the circuit under test decreases, the voltage Vcsq2 increases. For example, at a high temperature, the voltage Vcsq2 may be 0.6 volts (V), and at a low temperature, the voltage Vcsq2 may be 0.8V. The transistor Q2 may be a bipolar junction transistor (BJT). The first terminal of the transistor Q2 may be a collector terminal, the second terminal of the transistor Q2 may be an emitter terminal, and the control terminal of the transistor Q2 may be a base terminal. In some embodiments, the transistor Q2 may be replaced by a diode. The diode may include a first terminal coupled to the first terminal of the temperature coefficient component 10, and a second terminal coupled to the second terminal of the temperature coefficient component 10. The first terminal of the diode may be an anode, and the second terminal may be a cathode.

The multiplier 12 may amplify a temperature detection current Id to generate the amplified detection current Ia. Specifically, the temperature detection current Id may flow to the control terminal of the multiplier 12, and the amplified detection current Ia may flow to the first terminal of the multiplier 12. The multiplier 12 may include a transistor Q1. The transistor Q1 may include a first terminal coupled to the first terminal of the multiplier 12, a second terminal coupled to the second terminal of the multiplier 12, and a control terminal coupled to the control terminal of the multiplier 12. The transistor Q1 may be a BJT. The first terminal of the transistor Q1 may be a collector terminal, the second terminal of the transistor Q1 may be an emitter terminal, and the control terminal of the transistor Q1 may be a base terminal. The transistor Q1 may amplify the temperature detection current Id flowing to the control terminal thereof substantially by $\beta$ times to generate the amplified detection current Ia at its first terminal thereof, i.e., Ia=$\beta$*Id. $\beta$ is the current gain of transistor Q1, e.g., $\beta$ may be between 10 and 100. For example, when the temperature of the circuit under test varies with time, the temperature detection current Id will vary accordingly. A small change in the temperature detection current Id may be amplified by the transistor Q1 to generate a relatively large change in the amplified detection current Ia. In this manner, the amount of the temperature variation of the circuit under test may be determined by the amplified detection current Ia, thereby enhancing sensitivity and accuracy of a temperature detection performed by the temperature detector 1. The transistors Q1 and Q2 may be of the same type of transistors, e.g., both are NPN type BJTs. In some embodiments, the transistors Q1 and Q2 may be PNP type BJTs. In some embodiments, the multiplier 12 and the temperature coefficient component 10 may both be arranged in proximity to the circuit under test, and the transistors Q1 and Q2 of the same type may have the same turn-on voltage. In some embodiments, the multiplier 12 may be implemented by a digital multiplier.

A current Isq2 flowing out of the second terminal of the transistor Q2 and the voltage Vcsq2 may show a relationship approximated by an I-V characteristic curve of a typical diode. In other words, when the temperature of the circuit under test increases, the voltage Vcsq2 will decrease and the current Isq2 will increase. The temperature detection current Id may be equal to the current Isq2, that is, the temperature detection current Id will also increase. The temperature detection current Id is positively correlated to the temperature of the circuit under test. Since the amplified detection current Ia is positively correlated to the temperature detection current Id, the amplified detection current Ia will also increase, and the amplified detection current Ia is positively correlated to the temperature of the circuit under test. In addition, a current Isq1 flowing out of the second terminal of the transistor Q1 may approximately be a sum of the temperature detection current Id and the amplified detection current Ia, so the current Isq1 will also increase. Therefore, when the temperature of the circuit under test continues to rise over time, the temperature detection current Id, the amplified detection current Ia, and the current Isq1 will continue to increase. As a result, the operating temperature of the transistor Q1 will rise accordingly, increasing the temperature detection current Id, the amplified detection current Ia, and the current Isq1 again, and the condition may continue and may ultimately lead to a thermal runaway of the transistor Q1.

The temperature detector 1 may further include an impedance component Z1 to resolve the issue of thermal runaway. The impedance component Z1 is coupled between the second terminal of the temperature coefficient component 10 and the control terminal of the multiplier 12. That is, the control terminal of the multiplier 12 is coupled to the second terminal of the temperature coefficient component 10 via the impedance component Z1. The impedance component Z1 may be used as a negative feedback current component. In some embodiments, the impedance component Z1 may be a resistor, a capacitor, an inductor, or a combination thereof. FIG. 1 shows an example of the impedance component Z1 including a resistor R1. When the temperature of the circuit under test rises, the voltage Vcsq2 will drop, and the current Isq2, the temperature detection current Id, the amplified detection current Ia, and the current Isq1 will increase. A voltage at the node N1 may be equal to the voltage Vref1 or Vref2 taking away the voltage Vcsq2, and therefore, the voltage at the node N1 will increase. The voltage at the node N1 is positively correlated to the temperature of the circuit under test. A voltage at the control terminal of the transistor Q1 may be equal to the voltage at the node N1 taking away a voltage drop across the resistor R1, and the voltage drop across the resistor R1 is the product of the temperature detection current Id and the resistance of the resistor R1. As the temperature of the circuit under test rises, the temperature detection current Id may increase, resulting in a larger voltage drop across the resistor R1 between the node N1 and the control terminal of the transistor Q1, so as to reduce the voltage at the control terminal of the transistor Q1. For example, the resistor R1 may be used to maintain the voltage at the control terminal of the transistor Q1 substantially constant as the temperature rises. On the other hand, a voltage Vcsq1 between the control terminal and the second terminal of the transistor Q1 may be equal to subtracting a voltage at the second terminal of the transistor Q1 from the voltage at the control terminal of the transistor Q1, and the voltage at the second terminal of the transistor Q1 may be equal to the voltage Vref3. In this manner, the reduction in the voltage at the control terminal of the transistor Q1 may result in a reduction in the voltage Vcsq1. Further, the amplified detection current Ia may also be represented by $Ia=Is \cdot e^{Vcsq1/Vt}$, where Is is the saturation current of the transistor Q1, and Vt is the thermal voltage. That is, the reduction in the voltage Vcsq1 may further reduce the amplified detection current Ia that would otherwise continue to rise, to, for example, within the linear operating region of the transistor Q1, and the temperature detection current Id and the current Isq1 may be relatively reduced to within the linear operating region, thereby lowering the risk of thermal runaway in the transistor Q1. In some embodiments, the temperature coefficient component 10 and the impedance component Z1 may form a bias circuit to provide a bias voltage to the multiplier 12.

Figure 2:
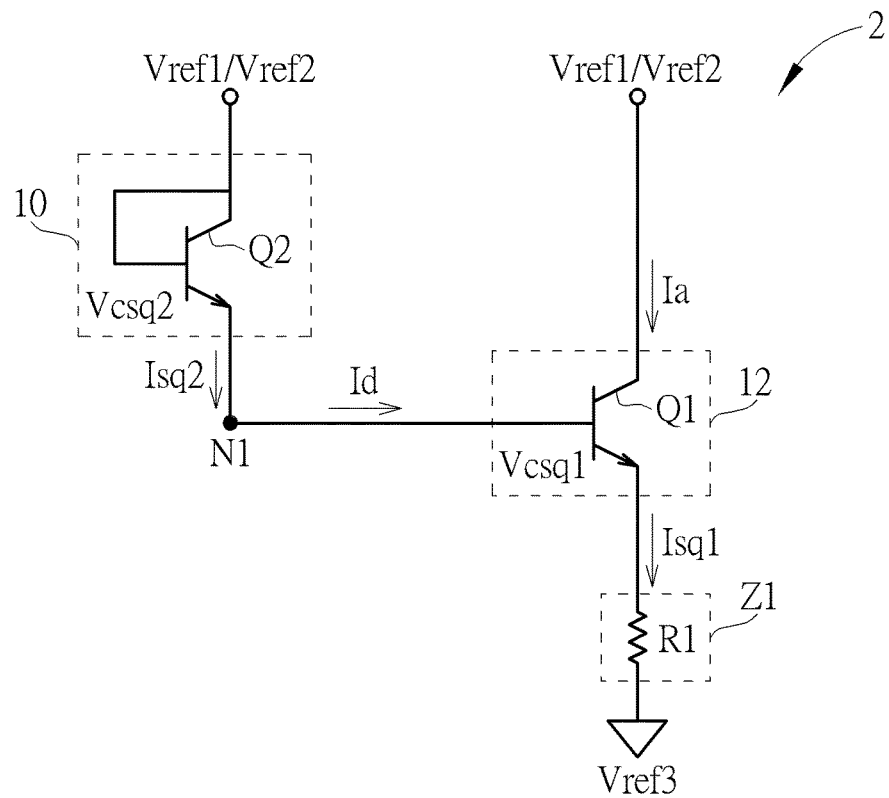
FIG. 2 is a circuit schematic of a temperature detector according to another embodiment of the invention.

FIG. 2 is a circuit schematic of a temperature detector 2 according to another embodiment of the invention. The difference between the temperature detectors 2 and 1 lies in the location of the impedance component Z1. The impedance component Z1 may be coupled between the second terminal of the multiplier 12 and the third voltage terminal. That is, the second terminal of the multiplier 12 is coupled to the third voltage terminal via the impedance component Z1. The resistance of the resistor R1 in the temperature detector 2 may be less than the resistance of the resistor R1 in the temperature detector 1. The resistance of the resistor R1 in the temperature detector 1 may be ($\beta$+1) times of the resistance of the resistor R1 in the temperature detector 2.

When the temperature of the circuit under test rises, the voltage Vcsq2 will drop, and the current Isq2, the temperature detection current Id, the amplified detection current Ia, and the current Isq1 will increase. The voltage at the node N1 may be equal to the voltage Vref1 or Vref2 taking away the voltage Vcsq2, and therefore, the voltage at the node N1 will increase. The voltage at the node N1 is positively correlated to the temperature of the circuit under test. The voltage Vcsq1 may be equal to the voltage at the node N1 taking away a voltage at the second terminal of the transistor Q1, and the voltage at the second terminal of the transistor Q1 may be equal to a voltage drop across the resistor R1. Since the voltage drop across the resistor R1 is the product of the current Isq1 and the resistance of the resistor R1, the current Isq1 positively correlated to the temperature of the circuit under test may result in a larger voltage drop across the resistor R1 between the second terminal of the transistor Q1 and the third voltage terminal, thereby reducing the voltage Vcsq1. Furthermore, the amplified detection current Ia may also be Vcsq1 expressed by $Ia=Is \cdot e^{Vcsq1/Vt}$, the decrease of the voltage Vcsq1 may further reduce the amplified detection current Ia that would otherwise continue to increase, to, for example, within the linear operating region of the transistor Q1, and the temperature detection current Id and the current Isq1 may be relatively reduced to within the linear operating region, thereby reducing the risk of thermal runaway in the transistor Q1.

Figure 3:
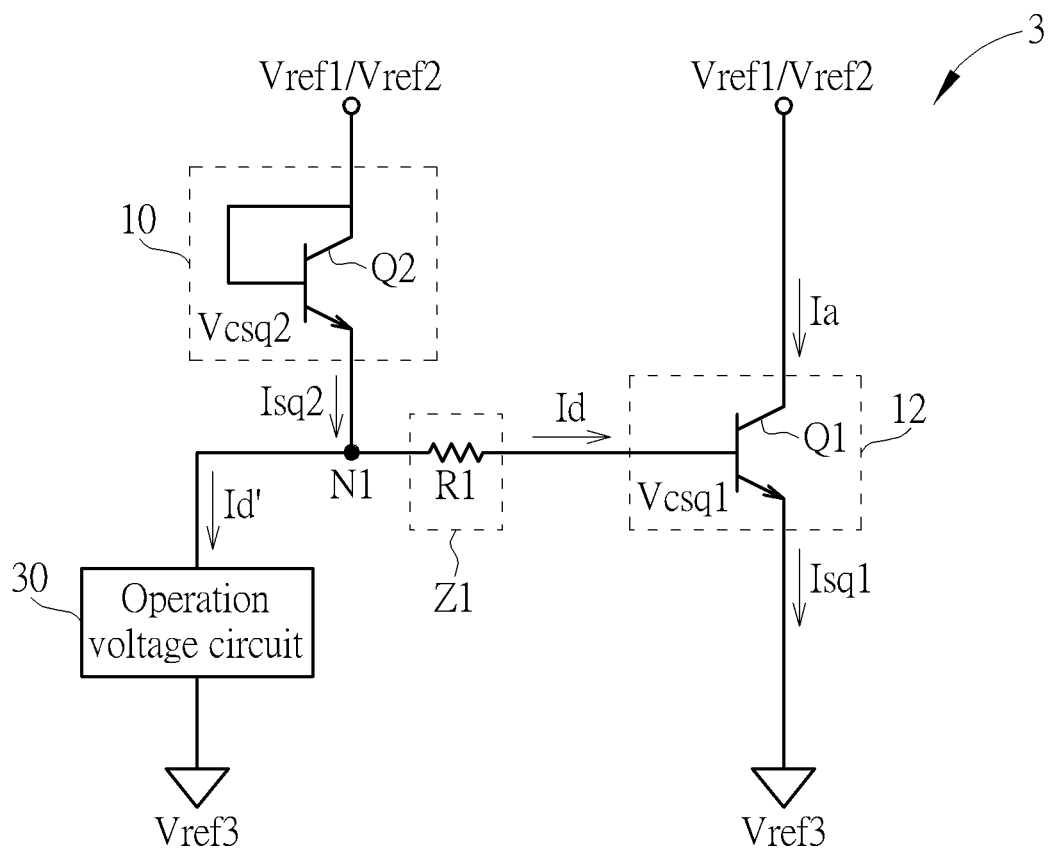
FIG. 3 is a circuit schematic of a temperature detector according to another embodiment of the invention.

FIG. 3 is a circuit schematic of a temperature detector 3 according to another embodiment of the invention. The temperature detectors 3 and 1 are similar except that the temperature detector 3 further includes an operation voltage circuit 30. The operation voltage circuit 30 includes a first terminal coupled to the node N1, and a second terminal coupled to the third voltage terminal.

The operation voltage circuit 30 may be arranged further away from the circuit under test than the temperature coefficient component 10. For example, the temperature coefficient component 10 and the circuit under test may be arranged on a first die in a chip, and the operation voltage circuit 30 may be arranged on a second die in the chip. The first die may be a gallium arsenide (GaAs) die, and the second die may be a silicon-on-insulator (SOI) die. The operation voltage circuit 30 may include a temperature coefficient component and an impedance component coupled in series between the first terminal of the operation voltage circuit 30 and the second terminal of the operation voltage circuit 30. The temperature coefficient component may include a transistor or a diode. The impedance component may be a resistor, a capacitor, an inductor, or a combination thereof. In some embodiments, the temperature coefficient component 10, the impedance component Z1 and the operation voltage circuit 30 may form a bias circuit to provide a more stable bias voltage to the multiplier 12. Further, the operation voltage circuit 30 may enhance the sensitivity of a temperature detection performed by the temperature detector 3. In some embodiments, the temperature detector 2 may also adopt the operation voltage circuit 30 to provide a more stable bias voltage to the multiplier 12 and enhance the sensitivity of a temperature detection performed by the temperature detector 2. In some embodiments, the operation voltage circuit 30 is arranged further away from the circuit under test than the multiplier 12. For example, the multiplier 12, the temperature coefficient component 10, and the circuit under test may be arranged on the first die, and the operation voltage circuit 30 may be arranged on the second die. In some embodiments, the impedance component Z1 may also be selectively arranged on the first die based on actual applications and design requirements.

Figure 4:
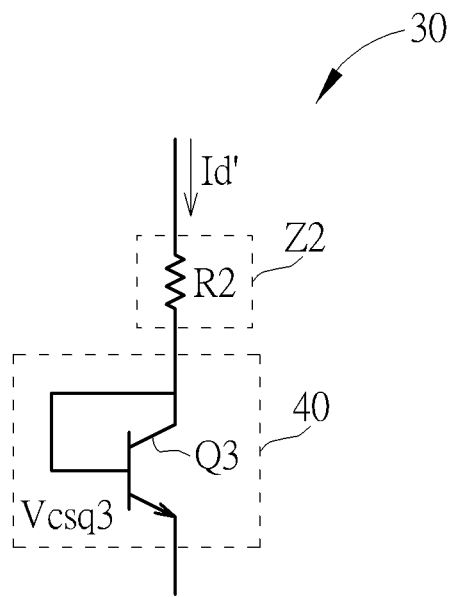
FIG. 4 is a circuit schematic of the operation voltage circuit in FIG. 3 according to an embodiment of the invention.

FIG. 4 is a circuit schematic of the operation voltage circuit 30 in FIG. 3 according to an embodiment of the invention. The operation voltage circuit 30 shows an example in which the impedance component Z2 and the temperature coefficient component 40 are sequentially coupled in series between the first terminal and the second terminal of the operation voltage circuit 30.

The impedance component Z2 may include a resistor R2. The resistor R2 may include a first terminal coupled to the first terminal of the operation voltage circuit 30, and a second terminal. The temperature coefficient component 40 may include a transistor Q3. The transistor Q3 may include a first terminal coupled to the second terminal of the resistor R2, a second terminal coupled to the second terminal of the operation voltage circuit 30, and a control terminal coupled to the first terminal of the transistor Q3. In other words, the transistor Q3 is a diode-connected transistor. A turn-on voltage of the transistor Q3 may be equal to a voltage Vcsq3 between the control terminal and the second terminal of the transistor Q3. The transistor Q3 may be a BJT. The first terminal of the transistor Q3 may be a collector terminal, the second terminal of the transistor Q3 may be an emitter terminal, and the control terminal of the transistor Q3 may be a base terminal. In some embodiments, the transistor Q3 may be replaced by a diode. The diode may include a first terminal coupled to the second terminal of the resistor R2, and a second terminal coupled to the second terminal of the operation voltage circuit 30. The first terminal of the diode may be an anode, and the second terminal may be a cathode.

Since the operation voltage circuit 30 is arranged at a location further away from the circuit under test, for example, at a room temperature of 25° C., the voltage Vcsq3 may remain substantially unchanged with respect to the temperature variation of the circuit under test. In other words, the voltage Vcsq3 may be substantially constant regardless of the temperature variation of the circuit under test. Referring to FIGS. 3 and 4, the temperature detection current Id' flowing to the operation voltage circuit 30 may approximately be the voltage at the node N1 taking away the voltage Vcsq3 and then divided by the resistance of the resistor R2. Since the voltage at the node N1 is positively correlated to the temperature of the circuit under test, the temperature detection current Id' will increase as the temperature of the circuit under test rises. On the other hand, in the temperature detector 3, the current Isq2 may approximately be the sum of the temperature detection currents Id and Id'. The current value of the current Isq2 in the temperature detector 3 will be larger than the current Isq2 in the temperature detector 1. In other words, the operation voltage circuit 30 may enlarge a current change of the current Isq2, thereby enhancing the sensitivity of the temperature detection performed by the temperature detector 3.

Figure 5:
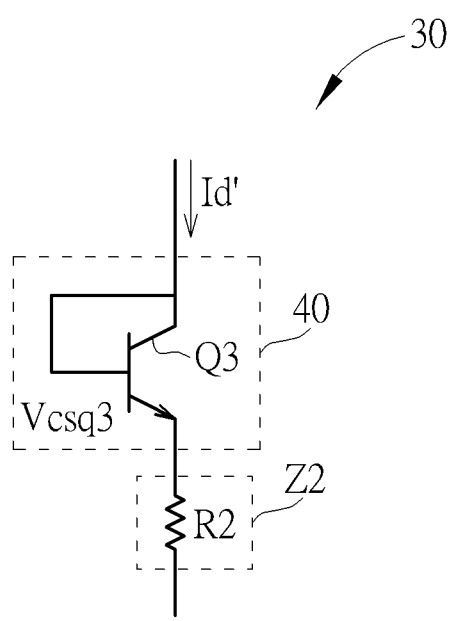
FIG. 5 is a circuit schematic of the operation voltage circuit in FIG. 3 according to another embodiment of the invention.

FIG. 5 is a circuit schematic of the operation voltage circuit 30 in FIG. 3 according to another embodiment of the invention. The difference between the operation voltage circuits 30 in FIG. 5 and FIG. 4 lies in that the temperature coefficient component 40 and the impedance component Z2 are coupled in opposite order. The operation voltage circuit 30 in FIG. 5 is an example in which the temperature coefficient component 40 and the impedance component Z2 are sequentially coupled in series between the first terminal and the second terminal of the operation voltage circuit 30. The transistor Q3 in the temperature coefficient component 40 may include a first terminal coupled to the first terminal of the operation voltage circuit 30, a second terminal, and a control terminal coupled to the first terminal of the transistor Q3. The resistor R2 in the impedance component Z2 may include a first terminal coupled to the second terminal of the transistor Q3, and a second terminal coupled to the second terminal of the operation voltage circuit 30. The operation of the operation voltage circuit 30 in FIG. 5 is similar to that in FIG. 4, and will not be repeated here for brevity.

Figure 6:
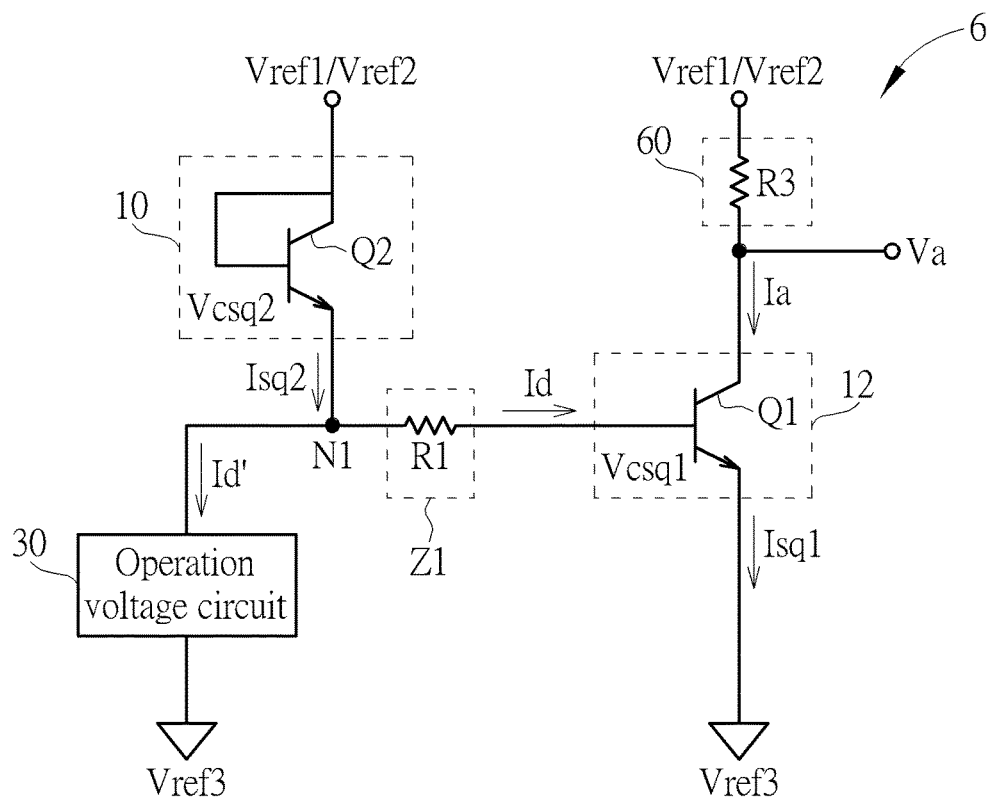
FIG. 6 is a circuit schematic of a temperature detector according to another embodiment of the invention.

FIG. 6 is a circuit schematic of a temperature detector 6 according to another embodiment of the invention. The temperature detectors 6 and 3 are similar except that the temperature detector 6 further includes a current-voltage converter 60. The current-voltage converter 60 may include a first terminal and a second terminal. The first terminal of the current-voltage converter 60 is coupled to the first voltage terminal or the second voltage terminal, and the second terminal of the current-voltage converter 60 is coupled to the first terminal of the multiplier 12. In other words, the first terminal of the multiplier 12 may be coupled to the first voltage terminal or the second voltage terminal via the current-voltage converter 60. The current-voltage converter 60 may include a resistor R3.

A current flowing through the current-voltage converter 60 may be equal to the amplified detection current Ia, and the current-voltage converter 60 may convert the amplified detection current Ia into an amplified detection voltage Va. Since the amplified detection current Ia is positively related to the temperature of the circuit under test, the amplified detection voltage Va is also positively related to the temperature of the circuit under test. In other words, the temperature detector 6 may generate the amplified detection voltage Va to reflect the temperature variation of the circuit under test. In some embodiments, the operation voltage circuit 30 may be removed from the temperature detector 6 according to actual applications and design requirements.

Figure 7:
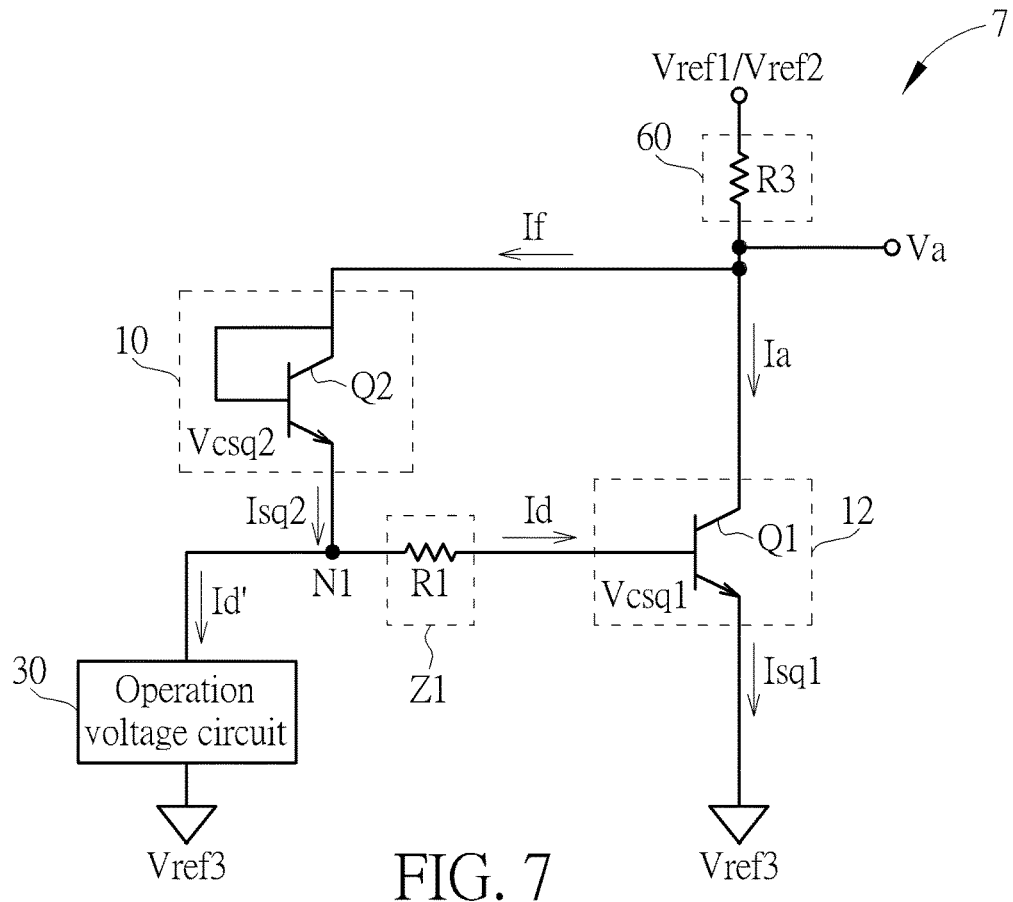
FIG. 7 is a circuit schematic of a temperature detector according to another embodiment of the invention.

FIG. 7 is a circuit schematic of a temperature detector 7 according to another embodiment of the invention. The temperature detectors 7 and 6 are similar except the coupling configuration of the current-voltage converter 60 in the temperature detector 7. The first terminal of the current-voltage converter 60 is coupled to the first voltage terminal or the second voltage terminal, and the second terminal of the current-voltage converter 60 is coupled to the first terminal of the multiplier 12 and the first terminal of the temperature coefficient component 10. Furthermore, the first terminal of the multiplier 12 and the first terminal of the temperature coefficient component 10 may be coupled to the first voltage terminal or the second voltage terminal via the current-voltage converter 60. That is, the first terminal of the multiplier 12 and the first terminal of the temperature coefficient component 10 may be coupled to the same voltage terminal via the current-voltage converter 60.

A current If flowing to the first terminal of the temperature coefficient component 10 may approximately be the current Isq2, and a current flowing through the current-voltage converter 60 may be equal to the sum of the current Isq2 and the amplified detection current Ia, and therefore, the current flowing through the current-voltage converter 60 in the temperature detector 7 will be larger than the current flowing through the current-voltage converter 60 in the temperature detector 6. That is, the variation of the current flowing through the current-voltage converter 60 in the temperature detector 7 is enlarged, thereby enhancing the sensitivity of the temperature detection performed by the temperature detector 7. The current-voltage converter 60 may be used to convert the current flowing therethrough into the amplified detection voltage Va. Since the current Isq2 and the amplified detection current Ia are positively related to the temperature of the circuit under test, the amplified detection voltage Va is also positively related to the temperature of the circuit under test. In other words, the temperature detector 7 may generate the amplified detection voltage Va to reflect the temperature variation of the circuit under test. In some embodiments, the operation voltage circuit 30 may be removed from the temperature detector 7 based on actual applications and design requirements. In some embodiments, the temperature detector 2 may adopt the current-voltage converter 60 in FIG. 6 or FIG. 7 to reflect the temperature variation of the circuit under test upon the amplified detection voltage Va.

Figure 8:
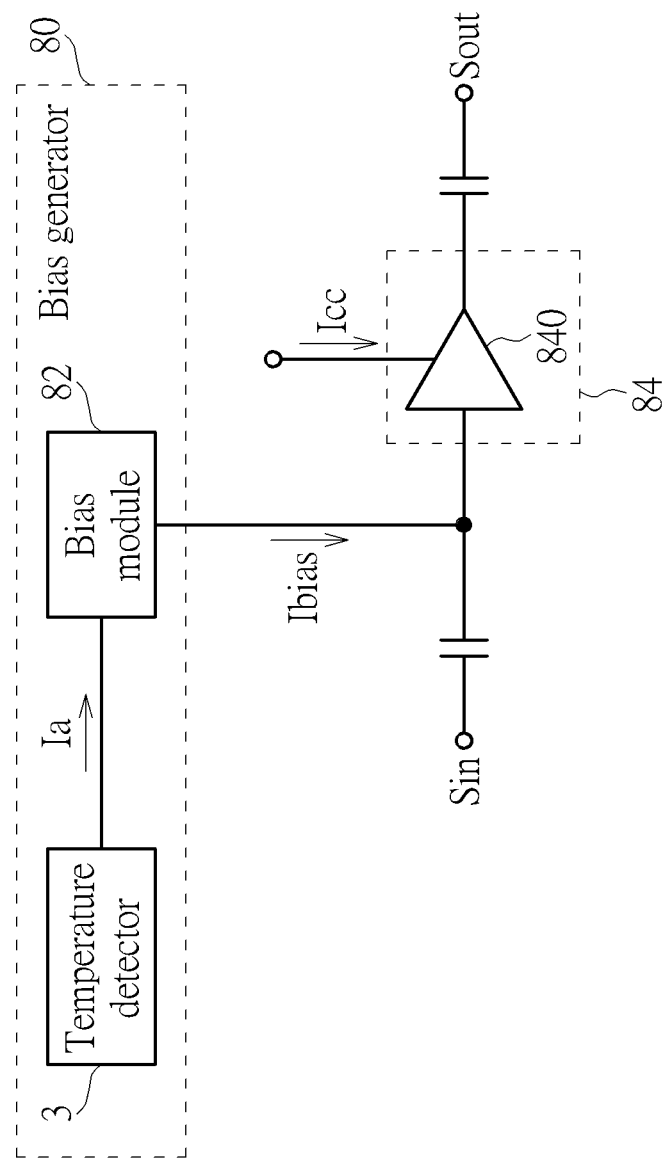
FIG. 8 is an application schematic of a temperature detector according to an embodiment of the invention.

FIG. 8 is an application schematic of a temperature detector 3 according to an embodiment of the invention. The temperature detector 3 and a bias module 82 may be used to form a part of a bias generator 80. As shown in FIG. 8, the bias generator 80 may include the temperature detector 3 and the bias module 82. The bias generator 80 may use the temperature detector 3 to detect the temperature of a circuit under test 84 to generate the amplified detection current Ia, and may use the bias module 82 to adjust a bias current Ibias according to the amplified detection current Ia. Please refer to FIGS. 3 and 8, in the embodiment, the bias module 82 may include an input terminal coupled to the first terminal of the multiplier 12 and configured to receive the amplified detection current Ia, and an output terminal coupled to the circuit under test 84. The circuit under test 84 may include a power amplifier 840. The power amplifier 840 may include an input terminal configured to receive an input signal Sin, an output terminal configured to output an output signal Sout, a bias terminal coupled to the output terminal of the bias module 82, and configured to receive the bias current Ibias, and a power terminal configured to receive a supply current Icc. The power amplifier 840 may be biased by the bias current Ibias, and the supply current Icc may be adjusted according to the bias current Ibias. The configuration and operation of the temperature detector 3 have been explained in the preceding paragraphs, and will not be repeated here for brevity.

The gain of the power amplifier 840 may change with the temperature. For example, the temperature of the power amplifier 840 may increase with the operation time, resulting in a decreased gain. When the temperature of the power amplifier 840 rises, the bias module 82 may determine the temperature change of the power amplifier 840 according to the increased amplified detection current Ia, and adjust the bias current Ibias accordingly, e.g., by increasing the bias current Ibias. The power amplifier 840 may adjust the supply current Icc according to the bias current Ibias, for example, by increasing the supply current Icc and maintaining the supply current Icc within a linear operating region. In this manner, the gain change resulting from the temperature variation of the power amplifier 840 may be compensated, thereby maintaining the gain of the power amplifier 840 within a predetermined gain range, and improving the performance of the power amplifier 840. In some embodiments, the temperature detector 1 or 2 may be used to replace the temperature detector 3 to detect the temperature of the power amplifier 840, and generate the amplified detection current Ia accordingly.

Figure 9:
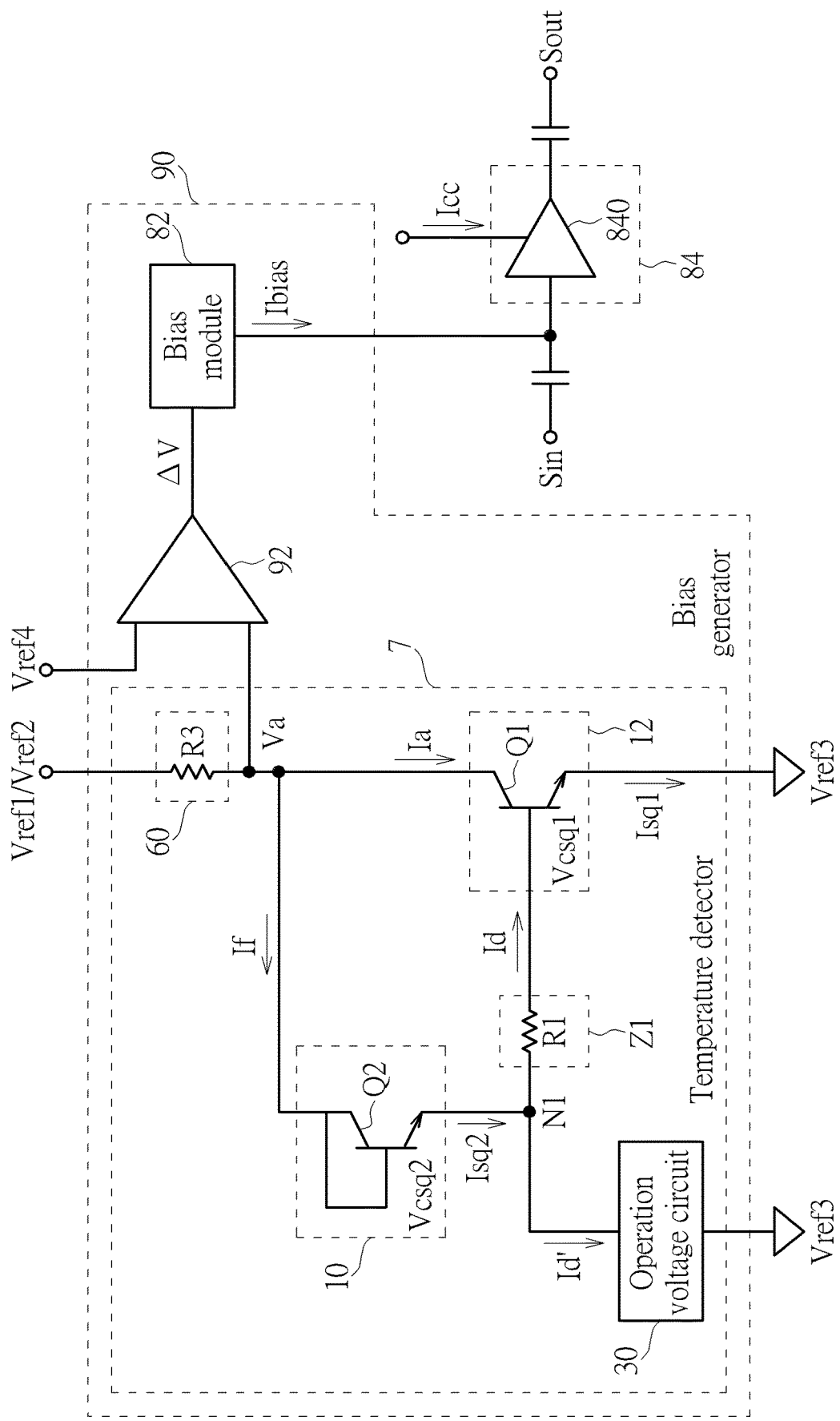
FIG. 9 is an application schematic of a temperature detector according to another embodiment of the invention.

FIG. 9 is an application schematic of a temperature detector 7 according to another embodiment of the invention. The bias generator 90 is different from the bias generator 80 in that the bias generator 90 further includes an operational amplifier 92 and the temperature detector 3 is replaced by a temperature detector 7. The operational amplifier 92 includes a first input terminal coupled to a fourth voltage terminal and configured to receive a voltage Vref4, and a second input terminal coupled to the second terminal of the current-voltage converter 60 and configured to receive the amplified detection voltage Va, and an output terminal coupled to the input terminal of the bias module 82 and configured to output a differential voltage ΔV. In FIG. 9, the input terminal of the bias module 82 is coupled to the first terminal of the multiplier 12 via the operational amplifier 92. In some embodiments, the voltage Vref4 may have substantially the same electrical potential as the voltage Vref1 and/or the voltage Vref2.

The operational amplifier 92 may be used to amplify a difference between the voltage Vref4 and the amplified detection voltage Va to generate the differential voltage ΔV at the output terminal of the operational amplifier 92. The differential voltage ΔV is positively correlated to the amplified detection current Ia. The bias module 82 may adjust the bias current Ibias according to the differential voltage ΔV. The power amplifier 840 may be biased by the bias current Ibias, and the supply current Icc may be adjusted according to the bias current Ibias. The configuration and operation of the temperature detector 7 have been explained in the preceding paragraphs, and will not be repeated here for brevity.

The gain of the power amplifier 840 may change with the temperature. For example, the temperature of the power amplifier 840 may increase with the operation time, resulting in a decreased gain. When the temperature of the power amplifier 840 rises, the amplified detection current Ia will increase, and the differential voltage ΔV will also increase, the bias module 82 may determine the temperature change of the power amplifier 840 according to the increased differential voltage ΔV, and adjust the bias current Ibias accordingly, e.g., by increasing the bias current Ibias. The power amplifier 840 may adjust the supply current Icc according to the bias current Ibias, for example, by increasing the supply current Icc and maintaining the supply current Icc within a linear operating region. In this manner, the gain change resulting from the temperature variation of the power amplifier 840 may be compensated, thereby maintaining the gain of the power amplifier 840 within a predetermined gain range, and improving the performance of the power amplifier 840. In some embodiments, the temperature detector 6 may be used to replace the temperature detector 7 to detect the temperature of the power amplifier 840, and generate the amplified detection voltage Va accordingly.

Figure 10:
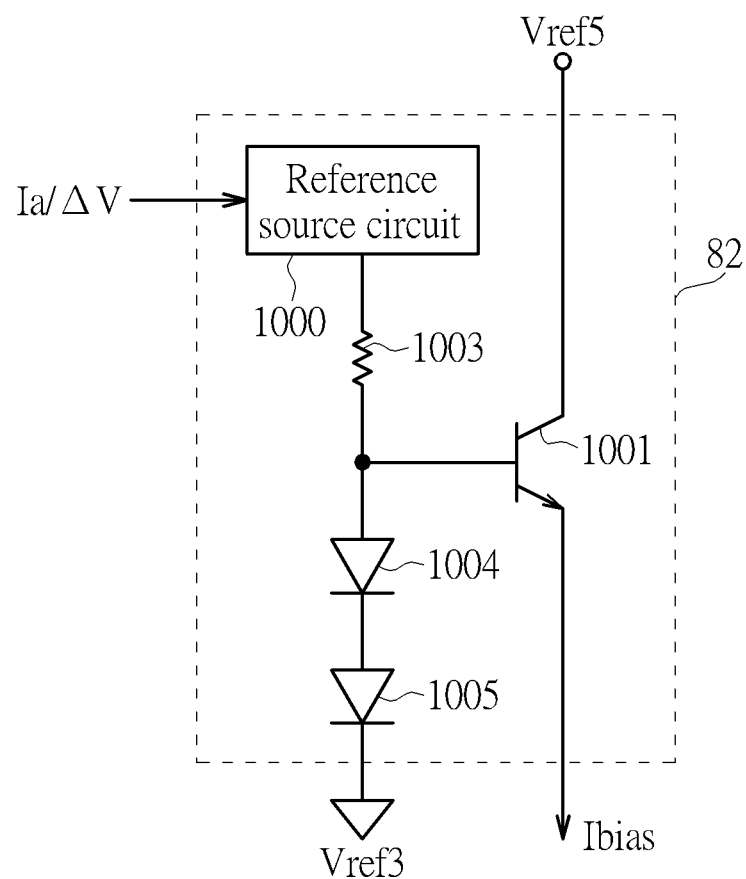
FIG. 10 is a circuit diagram of the bias module in FIG. 8 or FIG. 9.

FIG. 10 is a circuit diagram of the bias module 82 in FIG. 8 or FIG. 9. The bias module 82 may include a reference source circuit 1000, a resistor 1003, diodes 1004, 1005, and a transistor 1001. The reference source circuit 1000 is coupled to the input terminal of the bias module 82. The resistor 1003 may include a first terminal coupled to the reference source circuit 1000, and a second terminal. The diode 1004 includes a first terminal coupled to the second terminal of the resistor 1003, and a second terminal. The diode 1005 includes a first terminal coupled to the second terminal of the diode 1004, and a second terminal coupled to the third voltage terminal. The transistor 1001 may include a first terminal coupled to a fifth voltage terminal, a second terminal coupled to the output terminal of the bias module 82, and a control terminal coupled to the second terminal of the resistor 1003 and the first terminal of the diode 1004. The fifth voltage terminal may be used to provide the voltage Vref5. The voltage Vref5 may have substantially the same electrical potential as the voltage Vref1 and/or the voltage Vref2. The first terminals of the diodes 1004 and 1005 may be anodes, and the second terminals of the diodes 1004 and 1005 may be cathodes. In some embodiments, the diodes 1004 and/or 1005 may be diode-connected transistors.

The reference source circuit 1000 may be a voltage source or a current source. For example, when the temperature detector 1, 2 or 3 and the bias module 82 are used to form a part of the bias generator 80, the reference source circuit 1000 may be a current source for the bias module 82 to adjust the bias current Ibias according to the amplified detection current Ia. When the temperature detector 6 or 7, the bias module 82, and the operational amplifier 92 are used to form a part of the bias generator 90, the reference source circuit 1000 may be a voltage source for the bias module 82 to adjust the bias current Ibias according to the differential voltage ΔV associated with the amplified detection current Ia.

The temperature detectors in the various embodiments generate temperature detection current positively correlated to the temperature of the test under test by using a temperature coefficient component such as a negative temperature coefficient component, and placing the temperature coefficient component in proximity to the circuit under test, and amplify the temperature detection current having a small variation to generate an amplified detection current having a large variation by a multiplier, thereby reflecting the temperature variation of the circuit under test on the amplified detection current in a more visible manner, enhancing the sensitivity and the accuracy of the temperature detection. Further, when the temperature detector forms a part of the bias generator, the amplified detection current may be further used to reduce the effect on the circuit under test owing to the temperature change.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A temperature detector capable of detecting a temperature of a circuit under test, the temperature detector comprising:
   a first temperature coefficient component arranged in proximity to the circuit under test, and comprising a first terminal coupled to a first voltage terminal or a second voltage terminal, and a second terminal;
   a multiplier comprising a first terminal coupled to the first voltage terminal or the second voltage terminal, a second terminal coupled to a third voltage terminal, and a control terminal coupled to the second terminal of the first temperature coefficient component;
   a first impedance component coupled between the second terminal of the first temperature coefficient component and the control terminal of the multiplier or between the second terminal of the multiplier and the third voltage terminal;
   a node formed between the second terminal of the first temperature coefficient component and the control terminal of the multiplier; and
   an operation voltage circuit comprising a first terminal coupled to the node, and a second terminal coupled to the third voltage terminal;
   wherein a voltage at the node is positively correlated to the temperature of the circuit under test, and an amplified detection current flowing to the first terminal of the multiplier is positively correlated to the temperature of the circuit under test.

2. The temperature detector of claim 1, wherein the multiplier comprises a first transistor comprising a first terminal coupled to the first terminal of the multiplier, a second terminal coupled to the second terminal of the multiplier, and a control terminal coupled to the control terminal of the multiplier.

3. The temperature detector of claim 2, wherein the first transistor is a bipolar junction transistor, the first terminal of the first transistor is a collector terminal, the second terminal of the first transistor is an emitter terminal, and the control terminal of the first transistor is a base terminal.

4. The temperature detector of claim 1, wherein a turn-on voltage of the first temperature coefficient component is negatively correlated to the temperature of the circuit under test.

5. The temperature detector of claim 4, wherein the first temperature coefficient component comprises a second transistor comprising a first terminal coupled to the first terminal of the first temperature coefficient component, a second terminal coupled to the second terminal of the first temperature coefficient component, and a control terminal coupled to the first terminal of the second transistor.

6. The temperature detector of claim 4, wherein the first temperature coefficient component comprises a first diode comprising a first terminal coupled to the first terminal of the first temperature coefficient component, and a second terminal coupled to the second terminal of the first temperature coefficient component.

7. The temperature detector of claim 1, wherein the first impedance component comprises a first resistor.

8. The temperature detector of claim 1, wherein the operation voltage circuit is arranged further away from the circuit under test than the first temperature coefficient component.

9. The temperature detector described of claim 1, wherein the first temperature coefficient component and the circuit under test are arranged on a first die, and the operation voltage circuit is arranged on a second die.

10. The temperature detector of claim 9, wherein the first die is gallium arsenide (GeAs) die, and the second die is a silicon on insulator (SOI) die.

11. The temperature detector of claim 1, wherein the operation voltage circuit comprises:
    a second temperature coefficient component and a second impedance component coupled in series between the first terminal of the operation voltage circuit and the second terminal of the operation voltage circuit.

12. The temperature detector of claim 11, wherein the second temperature coefficient component comprises a third transistor or a second diode.

13. The temperature detector of claim 11, wherein the second impedance component comprises a second resistor.

14. The temperature detector of claim 1, further comprising:
    a current-voltage converter comprising a first terminal and a second terminal;
    wherein the first terminal of the current-voltage converter is coupled to the first voltage terminal or the second voltage terminal, the second terminal of the current-voltage converter is coupled to the first terminal of the multiplier, and the first terminal of the multiplier is coupled to the first voltage terminal or the second voltage terminal via the current-voltage converter; or
    the first terminal of the current-voltage converter is coupled to the first voltage terminal or the second voltage terminal, the second terminal of the current-voltage converter is coupled to the first terminal of the multiplier and the first terminal of the first temperature coefficient component, and the first terminal of the multiplier and the first terminal of the first temperature coefficient component are coupled to the first voltage terminal or the second voltage terminal via the current-voltage converter.

15. The temperature detector of claim 14, wherein the current-voltage converter comprises a third resistor.

16. A bias generator comprising:

a temperature detector configured to detect a temperature of a circuit under test, and comprising:
- a first temperature coefficient component arranged in proximity to the circuit under test, and comprising a first terminal coupled to a first voltage terminal or a second voltage terminal, and a second terminal;
- a multiplier comprising a first terminal coupled to the first voltage terminal or the second voltage terminal, a second terminal coupled to a third voltage terminal, and a control terminal coupled to the second terminal of the first temperature coefficient component;
- a first impedance component coupled between the second terminal of the first temperature coefficient component and the control terminal of the multiplier or between the second terminal of the multiplier and the third voltage terminal;
- a node formed between the second terminal of the first temperature coefficient component and the control terminal of the multiplier; and
- an operation voltage circuit comprising a first terminal coupled to the node, and a second terminal coupled to the third voltage terminal; and a bias module comprising an input terminal coupled to the first terminal of the multiplier, and an output terminal coupled to the circuit under test;

wherein a voltage at the node is positively correlated to the temperature of the circuit under test, and an amplified detection current flowing to the first terminal of the multiplier is positively correlated to the temperature of the circuit under test.

17. The bias generator of claim 16, further comprising:

a current-voltage converter comprising a first terminal and a second terminal, wherein the first terminal of the current-voltage converter is coupled to the first voltage terminal or the second voltage terminal, the second terminal of the current-voltage converter is coupled to the first terminal of the multiplier, and the first terminal of the multiplier is coupled to the first voltage terminal or the second voltage terminal via the current-voltage converter; or the first terminal of the current-voltage converter is coupled to the first voltage terminal or the second voltage terminal, the second terminal of the current-voltage converter is coupled to the first terminal of the multiplier and the first terminal of the first temperature coefficient component, and the first terminal of the multiplier and the first terminal of the first temperature coefficient component are coupled to the first voltage terminal or the second voltage terminal via the current-voltage converter.

18. The bias generator of claim 17, further comprising:

an operational amplifier comprising a first input terminal coupled to a fourth voltage terminal, a second input terminal coupled to the second terminal of the current-voltage converter, and an output terminal coupled to the input terminal of the bias module; wherein the input terminal of the bias module is coupled to the first terminal of the multiplier via the operational amplifier.

19. The bias generator of claim 16, wherein the circuit under test comprises a power amplifier.

* * * * *